United States Patent
Ono et al.

(10) Patent No.: US 6,914,771 B2
(45) Date of Patent: Jul. 5, 2005

(54) TRAY FOR ELECTRONIC COMPONENTS

(75) Inventors: Hirokazu Ono, 607, 1-15, Hatanaka 3-chome, Niiza-shi, Saitama-ken, 352-0012 (JP); Kunihiro Teshima, Oita-ken (JP)

(73) Assignees: Hirokazu Ono, Niiza (JP); Ohkawa Mold Designs & Engineering Co., Ltd., Oita-ken (JP)

( * ) Notice: Subject to any disclaimer, the term of this patent is extended or adjusted under 35 U.S.C. 154(b) by 106 days.

(21) Appl. No.: 10/436,248

(22) Filed: May 13, 2003

(65) Prior Publication Data

US 2003/0231469 A1 Dec. 18, 2003

(30) Foreign Application Priority Data

May 29, 2002 (JP) .......................................... 2002-156205
May 7, 2003 (JP) .......................................... 2003-128640

(51) Int. Cl.[7] .............................................. H05K 5/00
(52) U.S. Cl. ....................... 361/679; 206/725; 206/714
(58) Field of Search ........................ 361/679; 438/113, 438/125, 464; 29/732, 827, 831; 206/701, 706, 710–714, 716–718, 722–728; 220/532–533, 549

(56) References Cited

U.S. PATENT DOCUMENTS

| 4,069,916 | A | * | 1/1978 | Fowler et al. .............. 206/716 |
| 5,794,783 | A | * | 8/1998 | Carter ........................ 206/725 |
| 6,109,445 | A | * | 8/2000 | Beyer ......................... 206/714 |
| 6,227,372 | B1 | * | 5/2001 | Thomas et al. ............. 206/725 |

* cited by examiner

Primary Examiner—Yean-Hsi Chang
(74) Attorney, Agent, or Firm—Manabu Kanesaka

(57) ABSTRACT

A tray for accommodating electronic components with edge portions and contacts includes a main portion for forming the tray, and a plurality of accommodation cavities formed in the tray for accommodating a plurality of electronic components therein. Each accommodation cavity includes partition walls for surrounding the electronic components, support steps extending horizontally inwardly from lower ends of the partition walls to form a first space therein and to support the edge portions of the electronic component, and descending walls extending downwardly from the support steps to define the first space. Each partition wall has a lower portion with a first inclination for a mold removing operation, and each descending wall has a second inclination greater than that of the first inclination to be able to contact and support an edge of the electronic component when falling from the edge portion.

6 Claims, 8 Drawing Sheets

Prior Art

TRAY FOR ELECTRONIC COMPONENTS

BACKGROUND OF THE INVENTION

The present invention relates to a tray for electronic components and more particularly to an electronic component tray used for conveying or inspecting electronic components known as semiconductor devices of a bowl grid array (BGA) type.

Electronic components of semiconductor devices known as semiconductor chips are composed of integrated circuits such as wafers. A typical example thereof includes an electronic component known as a BGA type semiconductor device. Such electronic components are known to be small-sized and required to be manufactured in a clean air environment.

Further, trays for electronic components are being used not only for conveying electronic components in the manufacturing process but also for efficiently handling electronic components for the purposes of inspection or prevention of electrostatic discharge damage thereof.

Conventionally used trays for electronic components include those as shown in FIG. 10, which trays are incorporated with electronic components and built up in a multi-layered laminated structure for use. It is to be noted that the electronic components are accommodated in cavities 51 defined between the vertically laminated trays.

Such trays are used for handling electronic components accommodated within the cavities 51 defined in a laminated manner. Said electronic components to be thus accommodated therein are constantly being downsized as explained with reference to FIG. 8, now to the level of a square having one side of 1 cm. The tray 50 for electronic components as shown in FIG. 10 is a case in point, in which a number of electronic components 100 are accommodated therein as so far explained. In said tray 50 for electronic components, square cavities 51 for accommodating components are regularly formed in a grid iron pattern.

Part of each cavity 51 is shown in an enlarged cross section in FIGS. 11 and 12, wherein the numeral 52 denotes a peripheral wall defining the cavity 51. In the drawings, said peripheral wall 52 has inside wall surfaces 52A inwardly sloping to make the cavity 51 in the form of a cone-shaped hollow to define a wide opening 53 at the top thereof.

Immediately below said peripheral wall 52, there is formed a peripheral wall 52B having a wall surface substantially vertical but having a slight inclination of for example 7 degrees to make a mold removing operation easy during an injection molding.

Further, a step 54 is formed immediately below said peripheral wall 52B, said step 54 extending inwardly of the cavity 51 in the form of a shelf to receive an electronic component 100 thereon.

Said step 54 has a peripheral wall surface 55 immediately therebelow substantially vertically but having a slight inclination of 7 degrees to make a mold removing operation easy. The space surrounded by said wall surface 55 is defined as an accommodation space 56 for contacts provided on one side of the board 100 for the electronic component 100. A flat floor 57 extends inwardly from the lowermost end of said peripheral wall surface 55. Said flat floor 57 is centrally formed with an opening 57A in the interest of weight saving and cost reduction of the tray.

Next, the explanation will go to the case in which electronic components 100 or BGA semiconductor chips are accommodated in the thus constructed tray 10 for electronic components. Said electronic components 100 are substantially square such that each component may be independently accommodated within the cavities 51 regularly arranged in the grid iron pattern. Each of said electronic components 100 has a plurality of semi-spherical contacts regularly arranged on the board 10, leaving a peripheral portion 103 with no contacts arranged thereat.

For example, if one side of the board 101 of the electronic component shown in FIG. 8 has a length of 4.45 mm, said peripheral portion 103 thereof has a width of 0.345 mm or less. Said board 101 is accommodated to allow said peripheral portion 103 to be placed on said step 54 such that the contacts will not come into abutment against any portion of said contact accommodation space 56.

It is noted in this connection that said board 101 has some allowance in its size. Therefore, if the electronic component 100 is caused to move sideways on the step 54, the contact provided on the farthest end position can come into abutment against the peripheral wall 55 and be damaged. Further in the worst case, if the tray built up in said laminated structure is turned over upside down, one side of the peripheral portion 103 of the board 101 can fall from the step 54 because said step 54 of the electronic board 100 has an apron as narrow as 0.5 mm with the result that a contact 102 descending to the lowest level contacts the floor 57 to be damaged.

With reference to FIG. 8 and FIG. 9, the electronic component tray 50 is formed of a planar member having components accommodation spaces 51 arranged in a grid iron pattern, each component accommodation space 51 having an area larger than the projected area of an electronic component 100 such that the electronic component is accommodated at the area including the step 54. The peripheral portion 103 thereof is sized sufficient to be received on the step 54. However, since the distance between the peripheral portions 103 or the length of the one side of the electronic component board 101 has an established tolerance to allow fluctuation in an actual product size to such an extent that the some component has a sufficient peripheral portion size to be received on the step 54 while others have insufficient sizes for this purpose.

In other words, with the peripheral portion 103 of an electronic component 100 being supported on the step 54, the gap defined between the circumference of the electronic component 100 and the inner surrounding wall 52B allows the electronic component to be received in an unneutral position with the result that the contact 102X can come into abutment against the inner surrounding wall 55 immediately below the step 54 and be damaged.

Further, if the peripheral portion 103A at one side of said electronic component 100 falls from said step 54, there is another risk that the semispherical contact 102X at the extremity of the floor in said contact accommodating space 56 can fracture upon abutment against the floor 57 of the contact accommodation space 56.

One of the causes for such trouble is considered to be the posture of the peripheral wall 55 formed substantially at a right angle with respect to the floor 57. For example, if the peripheral portion 103 at one side of the board 101 of the electronic components falls from the step 54, said board 101 falls directly down onto the floor 57 since there is no buffering support midway.

SUMMARY OF THE INVENTION

In order to solve the above mentioned problems, the present invention provides an electronic component tray constructed such that a plurality of cavities are defined therein by surrounding partition walls in a grid iron pattern for accommodating electronic components, said electronic component tray having a support step formed at inner surroundings within said accommodation cavities to receive the peripheral portion of an electronic component board; and a contact accommodation space formed continuously from said support step for accommodating a group of contacts provided on the electronic component board, said contact accommodation space being surrounded by a descending wall having an inclination with respect to a vertical plane, said inclination being larger than that required for a mold removing operation during an injection molding. Therefore, even if the electronic component is supported horizontally in an unstable position, there is no risk of a contact coming into abutment against the descending wall or no risk of one side of the electronic component dropping far onto the floor because said one side is supported by the descending wall even if said one side falls from the step.

Further, it is to be noted that since the inclination larger than that required for the mold removing operation is 40 to 50 degrees with respect to a center line within the accommodation cavity, no contact on the electronic component come into abutment against the descending wall or fall down to the floor because the peripheral portion falling from the step abuts against the descending wall midway during the fall to prevent a further fall.

Further, it is to be noted that since the floor of the contact accommodation space has a floor having an opening in the center thereof, said floor having an underside defining a space to accommodate the non-contact side of the electronic component such that said space forms a space generally accommodating the electronic component in cooperation with said accommodation cavity when the tray is laid over another tray in a laminated structure. Therefore, if used in the laminated form, independent accommodation space is formed to protect the electronic component from external impacts.

It is further to be noted that said tray laid over in a laminated form includes an upper position tray having a surrounding wall and a lower position tray having a partition wall such that said upper and lower position trays cooperate to define said electronic component accommodation cavity, said upper and lower position trays having respective sloping inner walls. Therefore, the peripheral portion 103 of the electronic component falling from the step will not fall down onto the floor because the rising side peripheral portion thereof has a corner which is restricted.

It is further to be noted that since the electronic component includes a bowl grip array chip, a land grid array chip, and a flip chip array semiconductor chip, the contacts jutting from the board surface or the contacts formed in the board surface are securely protected.

The present invention solves the above mentioned technical problems and its object is to assure the prevention of damage due to the direct abutment of the group of contacts on the trays.

PREFERRED EMBODIMENTS

Figure 1:
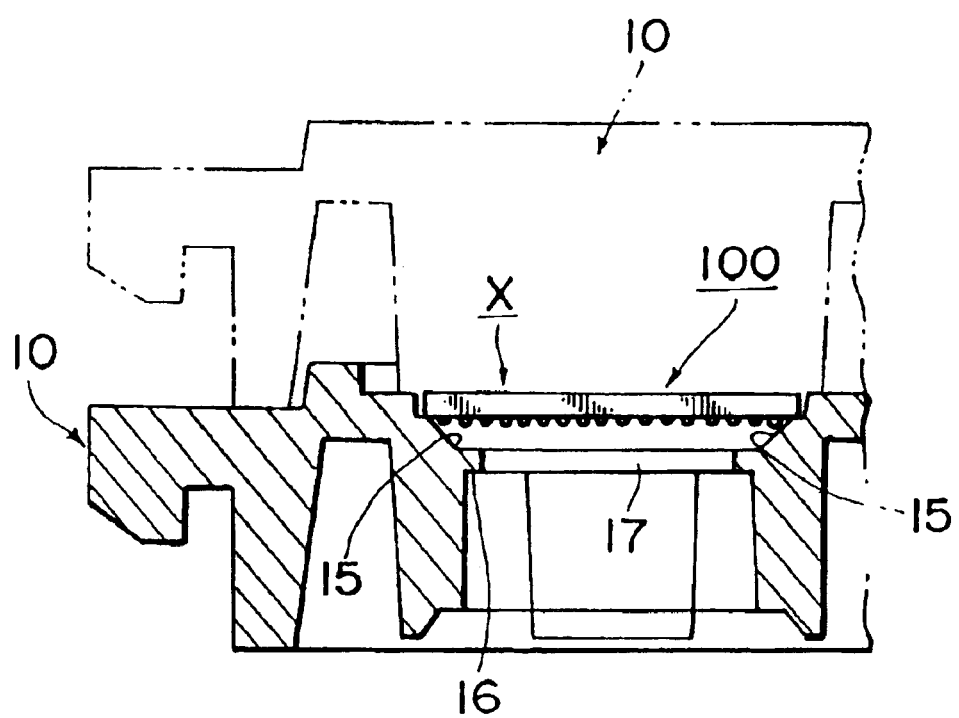
FIG. 1 is a cross sectional view of one embodiment of the present invention in which parts of the trays for the electronic components are laid over each other.
Figure 2:
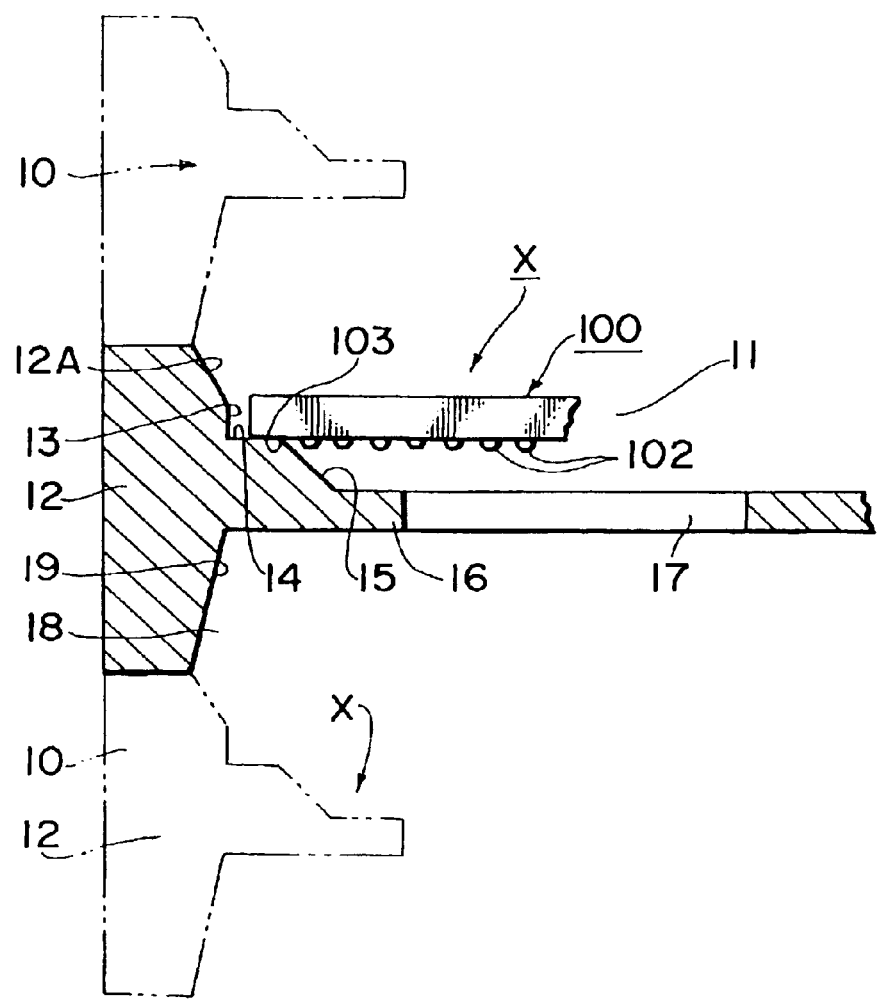
FIG. 2 is an enlarged cross section in part of the trays shown in FIG. 1 loaded with electronic components.
Figure 3:
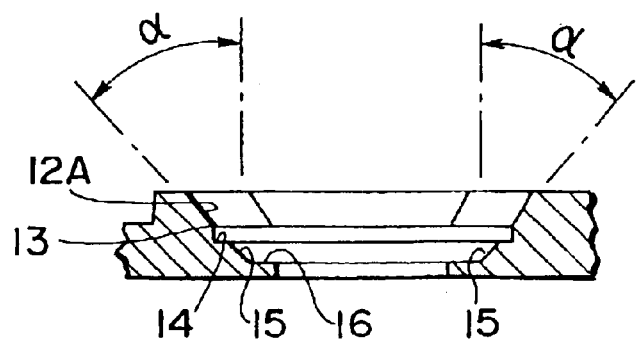
FIG. 3 is an explanatory cross section of the above mentioned embodiment to show the angles of various portions of the tray of the above mentioned embodiment.
Figure 8:
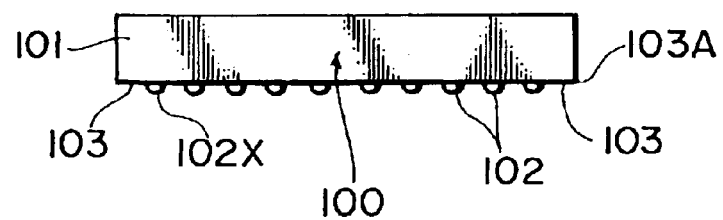
FIG. 8 is a side elevation showing one example of the electronic component to be accommodated in the conventional tray.
Figure 9:
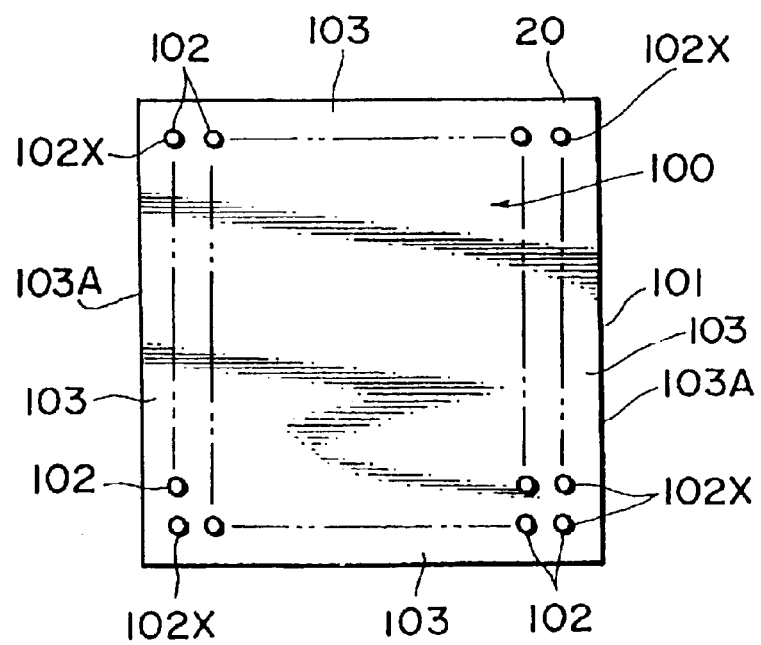
FIG. 9 is a plan view showing part of the electronic component to be accommodated in the tray.
Figure 10:
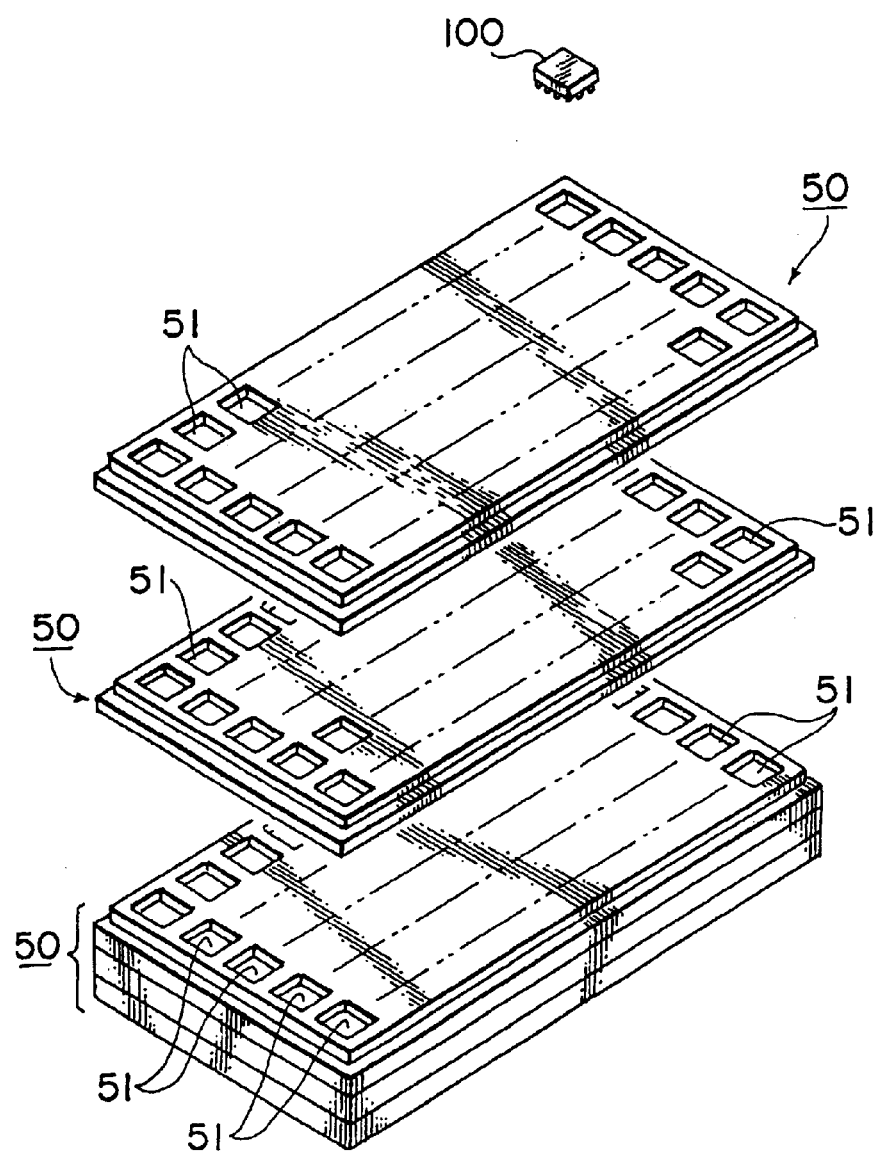
FIG. 10 is an enlarged perspective general view of the conventional tray.
Figure 11:
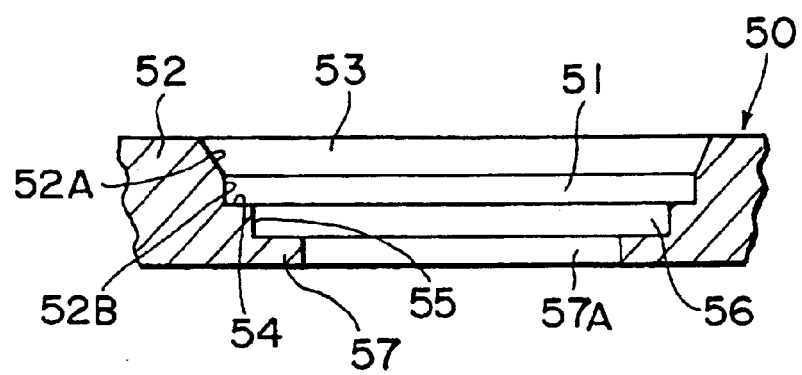
FIG. 11 is an enlarged perspective view of part of the conventional tray.
Figure 12:
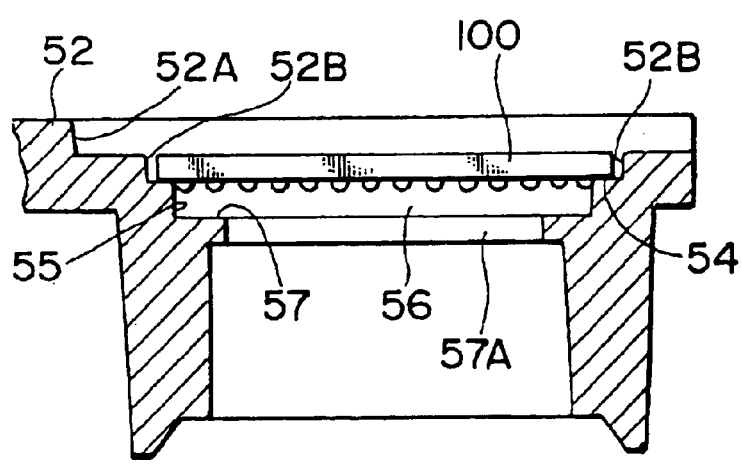
FIG. 12 is an enlarged cross section in part of the conventional trays laid in a laminated form.
Figure 13:
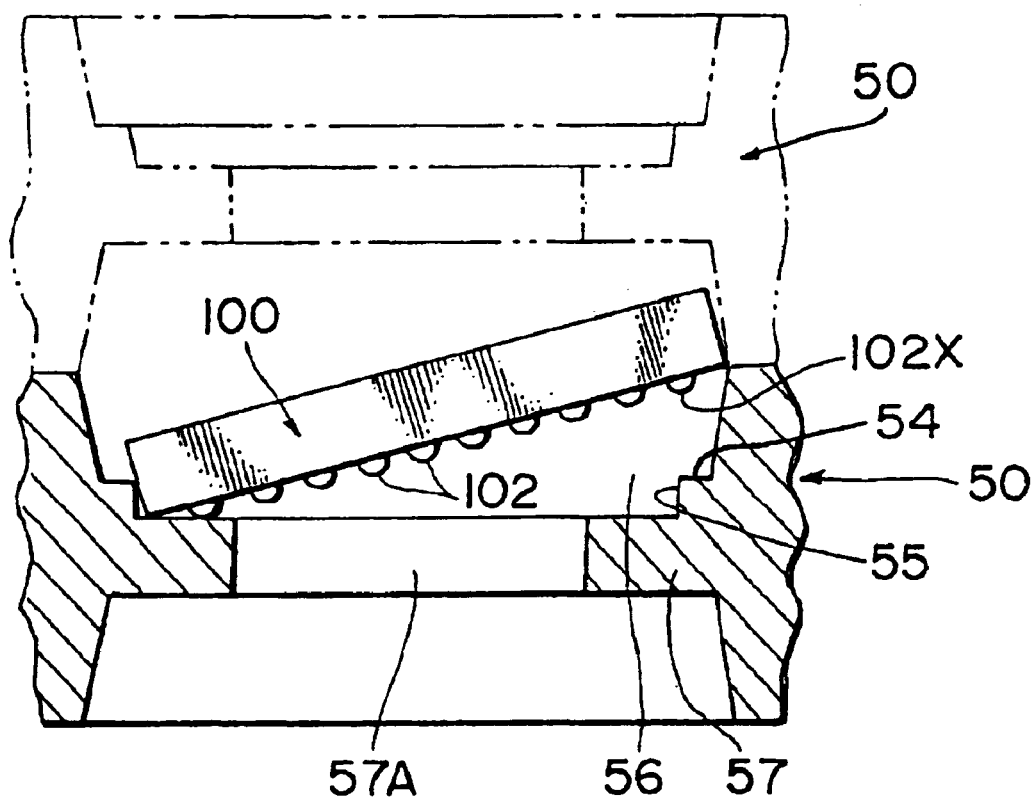
FIG. 13 is an enlarged cross section in part of the conventional trays with an electronic component being accommodated therein in which an edge portion thereof falling onto the floor.

Hereinafter, it is to be noted before the explanation of the embodiments of the tray according to the present invention that detailed explanation of the members bearing similar numerals as those of the prior art explained with reference to FIG. 8 is omitted First, FIG. 1 shows part of the tray for the electronic components (hereinafter referred to as a "tray") is shown in cross section, wherein the electronic component 100 is substantially a square board 101 having a side length of 4.45 mm in plan view, a thickness of 0.63 mm, and a width of 0.34 mm at the peripheral portion 103 thereof formed around the contacts 102, all of said dimensions being similar to those of the prior art explained so far. The closed cavities to accommodate are formed in the laminated tray 10.

Further, the embodiment of the present invention will be explained with reference to the attached drawings including FIGS. 1 through 7. The numeral 10 denotes a tray in FIG. 1. A plurality of such trays 10 are built up in a laminated structure such that the electronic components 100 such as IC chips are accommodated in a space defined between trays to be effectively distributed for subsequent steps as in the prior art. Therefore, it is to be noted that explanations are omitted with regards to the materials which are of plastic in the interest of prevention of static build-up.

Therefore, since the trays are constructed for use regardless of the difference of head or tail, they may be used up side down. However, explanation will be given with reference to the attached drawings, in which top and bottom are decided.

The tray 10 is formed with accommodation spaces 11 defined by walls formed in a grid iron pattern in accordance with the shape of the electronic device 100, for example square electronic device in this embodiment The electronic device 100 accommodated in said accommodation space 11 is composed of a board 101 provided with contacts 102 regularly arranged thereon in a grid iron pattern, said board further having a peripheral portion 103 with no contacts 102 thereat.

One example of the electronic device 100 is accommodated in the tray 10 as shown in FIG. 1.

The tray 10 accommodating said electronic devices 100 is formed with spaces defined by walls, said spaces being different in the top portion and the bottom portion. Spaces defined by vertically overlaying the trays 10 forms accommodation cavities X for the electronic components 100. Each accommodation cavity X is composed of an accommodation space 11 in the tray at a lower level and another accommodation space in the tray at an upper level which will be explained later. Each accommodation space 11 is partitioned by peripheral compartment walls 12 to have a lower portion composed of sloping wall 12A at grade descending off plumb. The lowermost end of said sloping wall 12A has an inclination of as small as 7 degrees for making a mold removing operation easy to become a substantially perpendicular wall 13.

Said compartment walls 12 may be formed at the whole area of the accommodation space 11 or at the corner portions of the accommodation space 11 or at a position receiving four corners of the board alone.

The lower portion of said compartment wall 12 are formed with a horizontal support step 14 (hereinafter referred to as a "step") extending inwardly in the form of a shelf having a width broader than the peripheral portion 103 of said electronic device 100.

Said step 14 has an inner edge continuing as a cone-shaped descending wall 15 in the form of a square in plan view. The inclination α of the descending wall 15 is preferably 45 degree or ±5 degrees in the neighborhood thereof. The vertical size thereof is a bit deeper than the thickness of the electronic component 100. Further, the gap between the upper edges of the descending walls 15 may be decided in accordance with the size of the electronic device 100 (4.45 mm at one side); that is, the perpendicular wall 13 has a size of 4.65 mm. The lower end of said descending wall 15 continues as a flange-shaped horizontal floor 16 having an opening 17 in the center thereof.

Particularly, said descending wall 15 has an inclination of about 7 degrees in an ordinary design for making a mold removing operation easy during an injection molding. In addition thereto, a more gradient is given.

Figure 4:
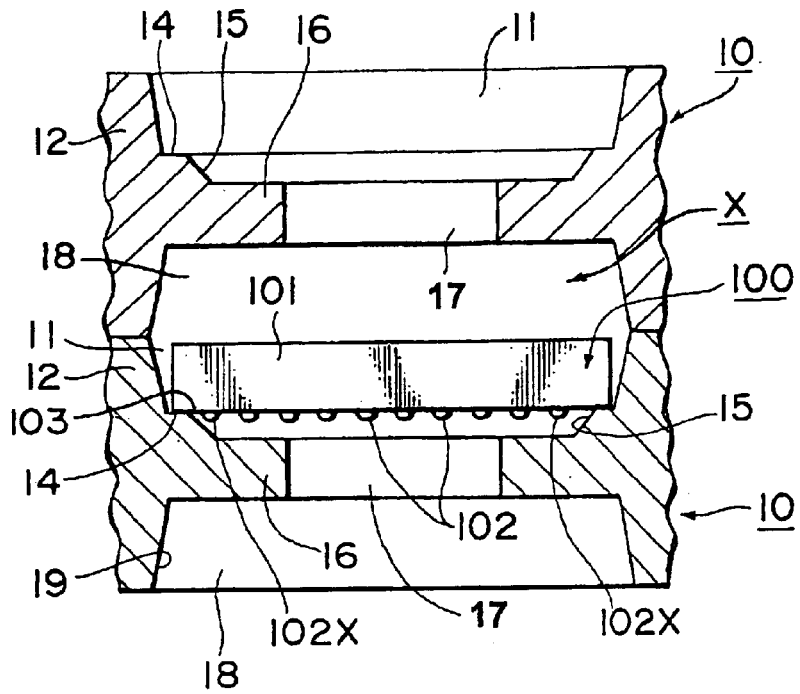
FIG. 4 is an enlarged cross section showing part of the electronic component loaded on the tray of the above embodiment.
Figure 5:
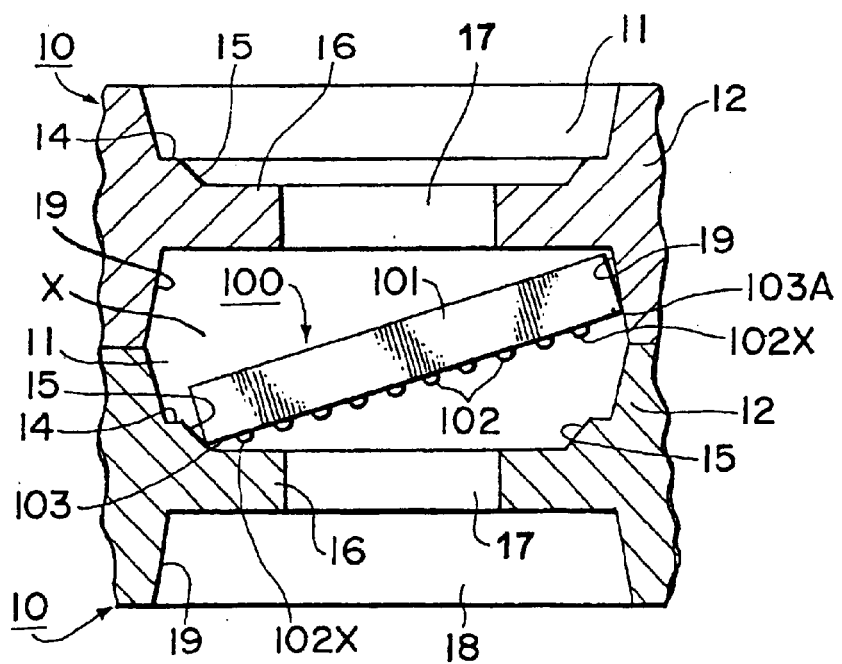
FIG. 5 is an enlarged cross section showing part of the electronic component loaded on the tray of the above embodiment, said electronic component falling in part from the step.

As shown in FIG. 4 and FIG. 5, the space below the floor 16 is defined by surrounding walls 19 to form a space 18, said surrounding walls 19 has an inclination similar to said opening 11. In other words, the space 18 below the floor 16 is formed by similar walls to said sloping wall 11 such that if the trays are overlaid into a laminated state, the space 11 between the lower tray 10 and the upper tray 10 is formed together with accommodation cavity X for accommodating electronic component 100.

Next, the method of actually handling the electronic device by means of the tray according to the present invention will be explained. First, as shown in enlarged cross section by FIG. 4, the electronic device 100 is accommodated in the accommodation cavity X formed when laying the trays 10 over in a laminated state, with the peripheral portion 103 of the electronic device 100 being supported on the step 14 such that the contacts on the board are positioned within the contact accommodation space 18.

It is to be noted in this connection that while the outermost contact 102X of the contacts 102 which is the closest to the step 14 is adapted to be kept away from the descending wall 15 in the event of the electronic device 100 shifts in either of the leftward or rightward directions, If the tray 10 as in the laminated state moves from this position or be turned over as shown in FIG. 5 to cause the one of the peripheral portions 103 of the electronic device to slip down from the step 14 within the accommodation cavity X onto the floor 16, the peripheral portion 103 comes into engagement with an intermediated portion in the descending wall 15 such that the edge portion 103A receives the restraint from the surrounding wall 19 within the cavity X since the descending wall 15 is provided with an inclination of for example 45 degrees. As a result, the falling side peripheral portion 103 will not fall down to the floor 16, thus maintaining a space, though small, between the contacts 102 and the floor 16.

More particularly, the edge portion 103A on the rising side of the electronic device is positioned within a space 18 in the underside of the floor 16 of the upper tray. Said edge portion 103A of the peripheral portion 103 is in direct contact with the surrounding wall 19 to keep the slanted posture.

Therefore, any of the contacts 102 will not come into contact with the floor 16, thus protecting the group of the contacts.

Figure 6:
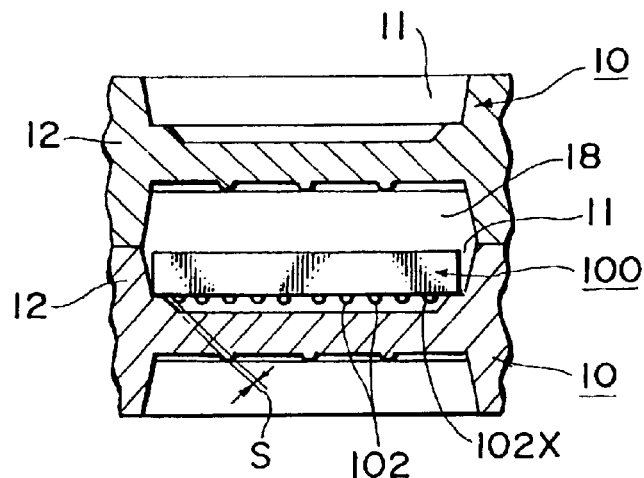
FIG. 6 is an explanatory enlarged cross section (not shaded) showing the electronic component being shifted horizontally to an unneutral position.
Figure 7:
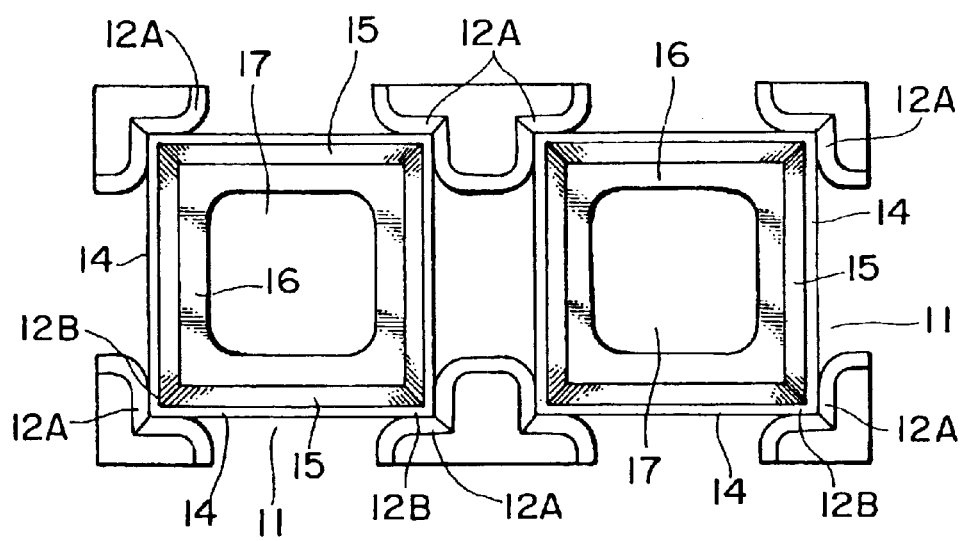
FIG. 7 is a plan view showing part of the embodiment of the invention.

Further, also in the event that the electronic device 100 shifts in either of horizontal directions as shown in FIG. 6, the space (a, about 0.04 mm) between the contact X at the extremity and the descending wall 15, the contact 102X will not come into abutment against the descending wall 15, thus avoiding a damage to the contact.

As seen from the explanation in the foregoing, the tray according the present invention is formed with a plurality of accommodating spaces and said accommodation spaces are defined by partition walls to be arranged in a grid iron pattern to accommodate the electronic devices therein. Said tray is composed of a support step formed within the accommodation space to place an edge portion of the board of the electronic device and a contact accommodation space formed in continuation from said support step to receive a group of contacts formed on the board of the electronic component. Since said accommodation space to receive the group of contacts is surrounded by the descending wall which is given an inclination larger than that required to make the mold removing operation easy with respect to a perpendicular wall, a gap is maintained between the contacts and the descending wall to prevent the contacts from engaging the descending wall even if the electronic components are placed at a position unstable horizontally. Moreover, even if one side of the electronic component falls from the step, said one side is supported by the descending wall and will not fall down to the floor.

Further, the inclination larger than that required for making the mold removing operation easy is 40 to 50 degrees with respect to the center line in said accommodation cavity. Therefore, the contacts of the electronic components will not come into abutment against the descending wall and it is possible to prevent the edge portion thereof from falling down onto the floor because the edge portion touches the descending wall midway even if the edge portion falls from the step.

Further, it is to be noted that said floor of the contact accommodation space is centrally formed with an opening while the underside of the floor defines a space for accommodating the non-contact side of the electronic component. Since the tray for electronic components are laid over another tray for electronic components such that an independent space for accommodating the electronic components is defined in addition to said contact accommodation space, said independent space or cavity thus formed helps protecting the electronic components from external impacts.

Further, the surrounding walls of an upper position tray in the laminated tray structure and the partition walls of a lower position tray therein cooperate to define an accommodation space or cavity for the electronic component, in which the inner walls of said spaces have sloping surfaces with the result that the contacts on the electronic component will not descend onto the floor even if the edge portion 103 thereof falls from the step portion because the rising side edge portion is restrained at its corner from further rising.

What is claimed is:

1. A tray for accommodating electronic components with edge portions and contacts, comprising:
   a main portion for forming the tray, and
   a plurality of accommodation cavities formed in the tray for accommodating a plurality of electronic components therein, each of said accommodation cavities including partition walls for surrounding the electronic components, each partition wall having a lower portion with a first inclination with respect to a vertical plane for a mold removing operation, support steps extending horizontally inwardly from lower ends of the partition walls to form a first space, therein and to support the edge portions of the electronic component such that the contacts are located inside the first space, and descending walls extending downwardly from the support steps to define the first space, each descending wall having a second inclination greater than the first inclination with respect to a vertical plane to be able to contact and support an edge of the electronic component when falling from the edge portion.

2. A tray for electronic components according to claim 1, wherein each partition wall includes an upper portion having an inclination greater than the first inclination.

3. A tray for electronic components according to claim 2, wherein said first inclination is about 7 degrees, and said second inclination is about 40 to 50 degrees with respect to a center line of each cavity.

4. A tray for electronic components according to claim 2, wherein each of said accommodation cavities further includes a floor with a center opening located at bottoms of the descending walls, and a second space at a side opposite to the floor relative to the first space for accommodating a noncontact side of the electronic component such that said second space cooperates with the first space for accommodating the electronic component when said tray is laminated with another tray.

5. A tray for electronic components according to claim 4, wherein each of said accommodation cavities includes an inclined surrounding wall extending downwardly for defining the second space.

6. A tray for electronic components according to claim 1, wherein each of said accommodation cavities has a rectangular shape in a plane, and said partition walls for each accommodation cavity are four formed at corners thereof.

* * * * *